(12) United States Patent
Nishii (10) Patent No.: US 11,004,986 B2
(45) Date of Patent: May 11, 2021

(54) SEMICONDUCTOR DEVICE INCLUDING ADJACENT SEMICONDUCTOR LAYERS

(71) Applicant: Mitsubishi Electric Corporation, Tokyo (JP)

(72) Inventor: Akito Nishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/080,649

(22) PCT Filed: Apr. 25, 2016

(86) PCT No.: PCT/JP2016/062898
§ 371 (c)(1),
(2) Date: Aug. 28, 2018

(87) PCT Pub. No.: WO2017/187477
PCT Pub. Date: Nov. 2, 2017

(65) Prior Publication Data
US 2019/0043998 A1 Feb. 7, 2019

(51) Int. Cl.
*H01L 29/861* (2006.01)
*H01L 29/868* (2006.01)
(Continued)

(52) U.S. Cl.
CPC ...... *H01L 29/8618* (2013.01); *H01L 29/0638* (2013.01); *H01L 29/32* (2013.01);
(Continued)

(58) Field of Classification Search
CPC .. H01L 29/8618; H01L 29/0638; H01L 29/32
See application file for complete search history.

(56) References Cited

U.S. PATENT DOCUMENTS 5,162,876 A * 11/1992 Kitagawa ............ H01L 29/0804
257/133
2001/0035565 A1* 11/2001 Yamaguchi ............ H01L 29/73
257/565
(Continued)

FOREIGN PATENT DOCUMENTS

JP 2004-088012 A 3/2004
JP 2010-283132 A 12/2010
(Continued)

OTHER PUBLICATIONS

International Search Report issued in PCT/JP2016/062898; dated Aug. 2, 2016.
(Continued)

*Primary Examiner* — Lex H Malsawma
*Assistant Examiner* — Xia L Cross
(74) *Attorney, Agent, or Firm* — Studebaker & Brackett PC (57) ABSTRACT

It is an object of the present invention to provide a technique of preventing electric-field concentration in a first P-type semiconductor layer during recovery operation. A semiconductor device includes a drift layer, an N-type semiconductor layer, a first P-type semiconductor layer, a second P-type semiconductor layer, an electrode, and an insulating layer. The N-type semiconductor layer and the first P-type semiconductor layer are disposed below the drift layer while being adjacent to each other in a lateral direction. The insulating layer is disposed above the first P-type semiconductor layer while being in contact with the second P-type semiconductor layer and the electrode.

7 Claims, 6 Drawing Sheets

(51) Int. Cl.

| | | |
|---|---|---|
| *H01L 29/739* | (2006.01) | |
| *H01L 29/78* | (2006.01) | |
| *H01L 29/06* | (2006.01) | |
| *H01L 29/32* | (2006.01) | |
| *H01L 29/40* | (2006.01) | |

(52) U.S. Cl.
CPC .......... *H01L 29/408* (2013.01); *H01L 29/739* (2013.01); *H01L 29/78* (2013.01); *H01L 29/861* (2013.01); *H01L 29/868* (2013.01)

(56) References Cited

U.S. PATENT DOCUMENTS

| | | |
|---|---|---|
| 2010/0308446 A1 | 12/2010 | Nakamura |
| 2013/0248882 A1 | 9/2013 | Ogura et al. |
| 2015/0129930 A1* | 5/2015 | Aono ................. H01L 29/7397 257/142 |
| 2015/0179638 A1* | 6/2015 | Noguchi ............... H01L 21/266 257/140 |
| 2016/0056306 A1 | 2/2016 | Masuoka et al. |

FOREIGN PATENT DOCUMENTS

| | | | |
|---|---|---|---|
| JP | 2012-059734 A | 3/2012 | |
| JP | 2013-065735 A | 4/2013 | |
| JP | 2013065735 A | * 4/2013 | ............. H01L 27/04 |
| JP | 2013-201360 A | 10/2013 | |
| WO | 2014/199465 A1 | 12/2014 | |
| WO | 2017/149607 A1 | 9/2017 | |

OTHER PUBLICATIONS

An Office Action mailed by the Japanese Patent Office dated Mar. 12, 2019, which corresponds to Japanese Patent Application No. 2018-513951 and is related to U.S. Appl. No. 16/080,649.

An Office Action mailed by the Japanese Patent Office dated Oct. 2, 2018, which corresponds to Japanese Patent Application No. 2018-513951 and is related to U.S. Appl. No. 16/080,649.

Office Action mailed by China National Intellectual Property Administration on Dec. 29, 2020, which corresponds to Chinese Patent Application No. 201680084787.1 and is related to U.S. Appl. No. 16/080,649 with English language translation.

* cited by examiner

SEMICONDUCTOR DEVICE INCLUDING ADJACENT SEMICONDUCTOR LAYERS

TECHNICAL FIELD

The present invention relates to semiconductor devices, such as diodes.

BACKGROUND ART

A conventional semiconductor device, such as a diode, has a back-surface structure provided with an N-type semiconductor layer of high concentration on the cathode side of the device (hereinafter referred to as an "N-type cathode layer") in order to establish ohmic contact between an electrode and a drift layer or a buffer layer. In such a structure, a sudden rise in voltage can damage the device at the final stage of device's recovery operation. To solve this problem, Patent Document 1, for instance, proposes a configuration in which a P-type semiconductor layer is disposed on the cathode side (hereinafter referred to as a "P-type cathode layer"). In such a configuration, carriers are injected from the cathode side. This relieves electric-field fluctuations, thereby preventing the sudden rise in voltage.

PRIOR ART DOCUMENT

Patent Document

Patent Document 1: Japanese Patent Application Laid-Open No. 2010-283132

SUMMARY

Problem to be Solved by the Invention

Unfortunately, the P-type cathode layer, together with a P-type semiconductor layer on the anode side of the device (hereinafter referred to as a "P-type anode layer"), forms a parasitic PNP transistor. Sometimes this causes the parasitic PNP transistor to operate during the recovery operation. Accordingly, a P-type cathode region has high density of current, thus causing current concentration involving heat. The heat can damage the device.

To solve the above problem, it is an object of the present invention to provide a technique of preventing electric-field concentration in a first P-type semiconductor layer, such as a P-type cathode region, during recovery operation.

Means to Solve the Problem

A semiconductor device according to a first aspect of the present invention includes the following: a drift layer; an N-type semiconductor layer and a first P-type semiconductor layer that are disposed below the drift layer while being adjacent to each other in a lateral direction; a second P-type semiconductor layer disposed on the drift layer; an electrode disposed on the second P-type semiconductor layer; and an insulating layer disposed above the first P-type semiconductor layer while being in contact with the second P-type semiconductor layer and the electrode.

A semiconductor device according to a second aspect of the present invention includes the following: a drift layer; an N-type semiconductor layer and a first P-type semiconductor layer that are disposed below the drift layer while being adjacent to each other in a lateral direction; a second P-type semiconductor layer disposed on or above the drift layer; an electrode disposed on the second P-type semiconductor layer; a first N-type buffer layer disposed above the N-type semiconductor layer and on the drift layer, or disposed on the N-type semiconductor layer and under the drift layer; and a second N-type buffer layer disposed above the first P-type semiconductor layer and on the drift layer, or disposed on the first P-type semiconductor layer and under the drift layer, while being adjacent to the first N-type buffer layer in a lateral direction. The second N-type buffer layer has an impurity concentration higher than an impurity concentration of the first N-type buffer layer.

Effects of the Invention

According to the present invention, the insulating layer or the second N-type buffer layer, which has an impurity concentration higher than an impurity concentration of the first N-type buffer layer, is disposed above the first P-type semiconductor layer. This prevents the electric-field concentration in the first P-type semiconductor layer during the recovery operation.

These and other objects, features, aspects and advantages of the present invention will become more apparent from the following detailed description of the present invention when taken in conjunction with the accompanying drawings.

DESCRIPTION OF EMBODIMENT(S)

First Embodiment

The following details semiconductor devices according to the present invention that are diodes of power modules that are resistant to high voltage and are used under a voltage of 600 V or more. The semiconductor devices according to the present invention are not limited to diodes, and can be any type of semiconductor device, such as Insulated Gate Bipolar Transistors (IGBTs).

Before describing a diode according to the first embodiment of the present invention, the following describes a diode relating to the diode according to the first embodiment (hereinafter referred to as a "related diode").

Figure 1:
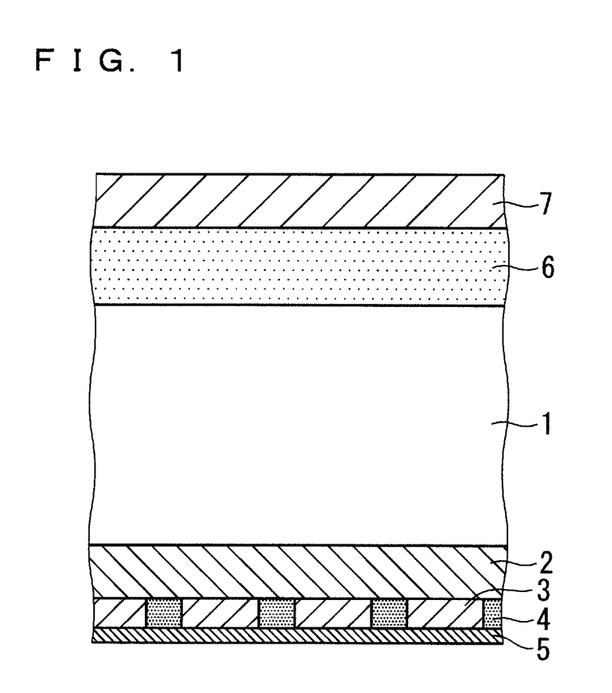
FIG. 1 is a cross-sectional view of the configuration of a related diode.

FIG. 1 is a cross-sectional view of the configuration of the related diode. It is noted that directions, such as up and down directions, are specified just for convenience and are thus changed, as appropriate, in accordance with a direction of device attachment, in FIG. 1 and the rest of the drawings and the description thereof.

The related diode in FIG. 1 includes a drift layer 1, an N-type cathode buffer layer 2, an N-type cathode layer (N-type semiconductor layer) 3, a P-type cathode layer (first P-type semiconductor layer) 4, a cathode electrode 5, a P-type anode layer (second P-type semiconductor layer) 6, and an anode electrode (electrode) 7.

An example of the drift layer 1 is a semiconductor layer of N-type.

The N-type cathode buffer layer 2 is disposed under the drift layer 1. The N-type cathode buffer layer 2 has an impurity concentration higher than the impurity concentration of the drift layer 1.

The N-type cathode layer 3 and the P-type cathode layer 4 are disposed under the N-type cathode buffer layer 2 while being adjacent to each other in a lateral direction. That is, the N-type cathode layer 3 and the P-type cathode layer 4 are disposed below the drift layer 1. The N-type cathode buffer layer 3 has an impurity concentration higher than the impurity concentration of the N-type cathode buffer layer 2.

The cathode electrode 5 is disposed under the N-type cathode layer 3 and the P-type cathode layer 4 while being in ohmic contact with the N-type cathode layer 3 and the P-type cathode layer 4.

The P-type anode layer 6 is disposed on the drift layer 1. The P-type anode layer 6 is formed through, for instance, impurity diffusion.

The anode electrode 7 is disposed on the P-type anode layer 6 while being in ohmic contact with the P-type anode layer 6.

The related diode with such a configuration has a parasitic PNP bipolar transistor formed by the P-type cathode layer 4, the P-type anode layer 6, and the N-type semiconductor layer therebetween. Here, while the related diode is recovering, the related diode is in reverse-biased state in which a high voltage is applied to the cathode side of the diode; moreover, a depletion layer extends from an PN junction on the anode side of the diode to the cathode side in accordance with a voltage which is applied between the anode electrode 7 and the cathode electrode 5.

The depletion layer, when reaching the P-type cathode layers 4 on the back-surface side of the diode, causes punch through. At this stage, carriers stored in the drift layer 1 during the ON state of the related diode pass through a region of the PNP bipolar transistor in which the punch through occurs. Accordingly, the density of current in this region increases, thus causing current concentration.

Figure 2:
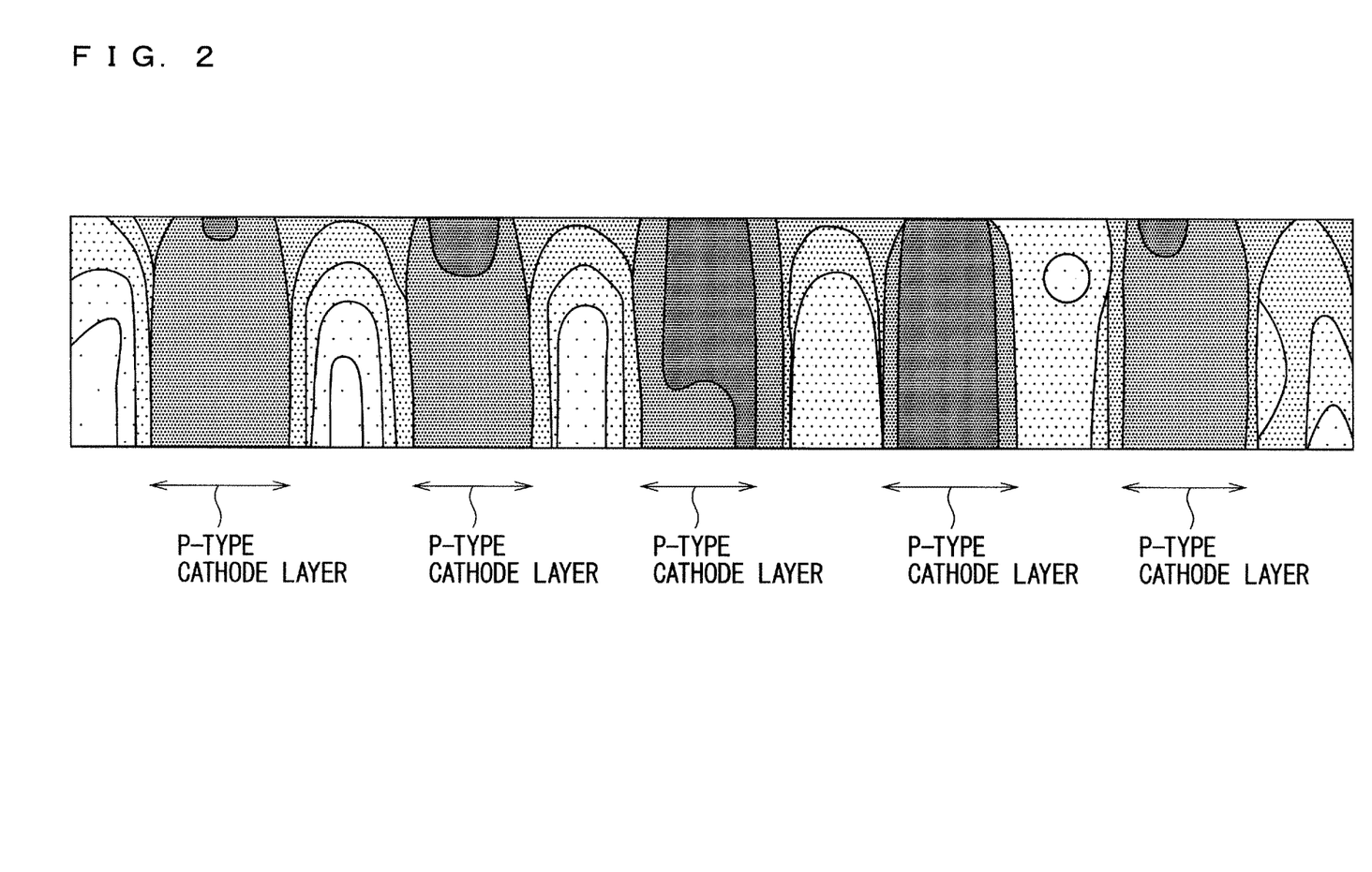
FIG. 2 is a diagram showing the result of a simulation of the current distribution during the recovery operation of the related diode.

FIG. 2 is a diagram showing the result of a simulation of the current distribution in the inside of the related diode during its recovery. FIG. 2 illustrates the current distribution in such a manner that the current is higher as the density of hatching dot increases. As seen from FIG. 2, the current is higher in the region of the P-type cathode layer 4.

A rise in heat resulting from such current concentration can damage the related diode. The diode according to the first embodiment, in contrast, prevents a rise in heat due to current concentration during its recovery operation.

Figure 3:
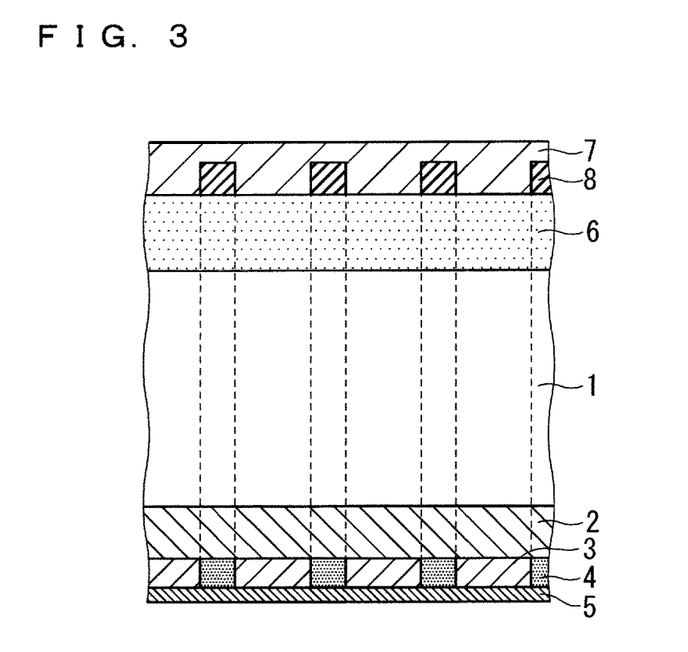
FIG. 3 is a cross-sectional view of the configuration of a diode according to a first embodiment.

FIG. 3 is a cross-sectional view of the configuration of the diode according to the first embodiment. The same or similar components between the related diode and the diode according to the first embodiment are denoted by the same reference signs. Mainly described are components different between these diodes.

The diode according to the first embodiment includes an insulating layer 8 in addition to the components included in the related diode. The insulating layer 8 is disposed above the P-type cathode layer 4 while being in contact with the P-type anode layer 6 and the anode electrode 7. In the first embodiment, the insulating layer 8 is in contact with the upper surface of the P-type anode layer 6 while being buried in the lower surface of the anode electrode 7.

In the diode according to the first embodiment, the insulating layer 8 reduces the tendency of carriers to go out of the P-type cathode layer 4 below the insulating layer 8. This prevents the unnecessary operation of the parasitic PNP bipolar transistor during the recovery operation; that is, this prevents the current concentration in the region of the P-type cathode layer 4, thereby improving breakdown strength.

It is noted that the semiconductor layers, including the drift layer 1, each may be formed of a wide-bandgap semiconductor (containing, for instance, silicon carbide, gallium nitride, or diamond); alternatively these semiconductor layers each may be formed of any other semiconductor (containing silicon for instance). Wide-bandgap semiconductors, when used to form the semiconductor layers, including the drift layer 1, enable stable operation under high temperature and high-speed operation.

<Modification>

The first embodiment describes an example in which the insulating layer 8 is in contact with the upper surface of the P-type anode layer 6 while being buried in the lower surface of the anode electrode 7. The configuration of the insulating layer 8 is not limited to this example.

Figure 4:
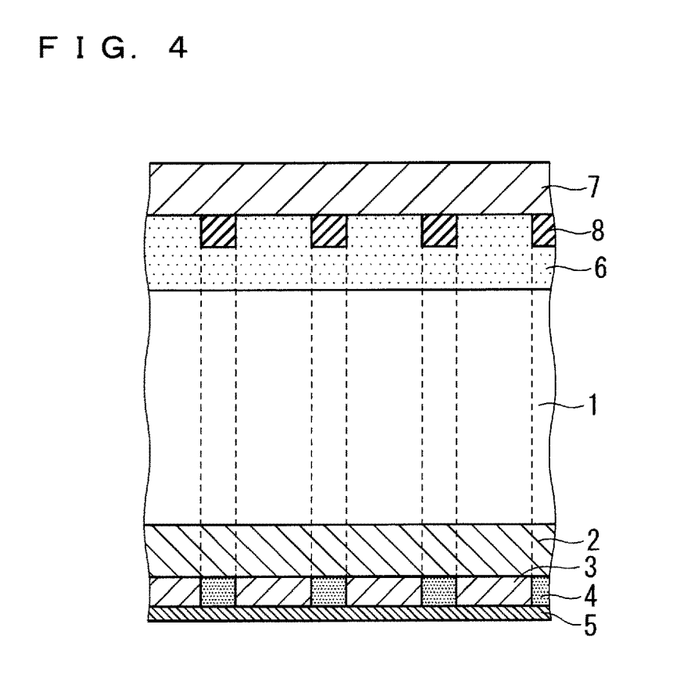
FIG. 4 is a cross-sectional view of the configuration of a diode according to a modification of the first embodiment.

For instance, in a first modification illustrated in FIG. 4, the insulating layer 8 may be in contact with the lower surface of the anode electrode 7 while being buried in the upper surface of the P-type anode layer 6. Such a configuration achieves an effect similar to that of the first embodiment.

Figure 5:
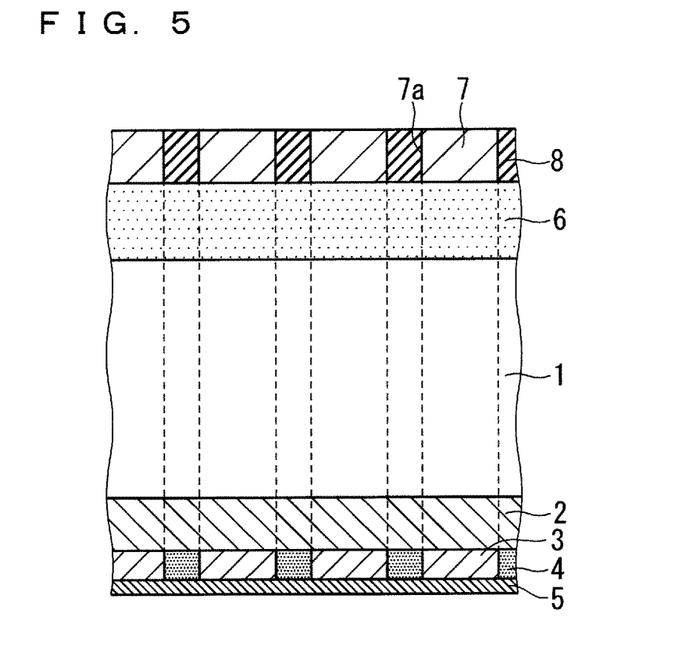
FIG. 5 is a cross-sectional view of the configuration of a diode according to a modification of the first embodiment.

For instance, in a second modification illustrated in FIG. 5, the insulating layer 8 may be in contact with the upper surface of the P-type anode layer 6 while being buried in a through-hole 7a of the anode electrode 7, the through-hole 7a extending in its thickness direction. Such a configuration achieves an effect similar to that of the first embodiment.

Second Embodiment

Figure 6:
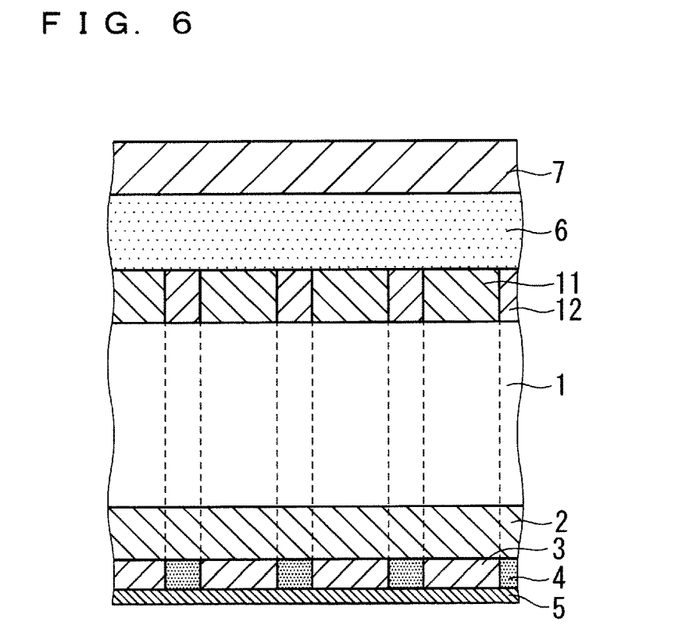
FIG. 6 is a cross-sectional view of the configuration of a diode according to a second embodiment.

FIG. 6 is a cross-sectional view of the configuration of a diode according to the second embodiment of the present invention. The same or similar components between the first and second embodiments are denoted by the same reference signs. Mainly described are components different between these embodiments.

In the second embodiment, the diode includes N-type anode buffer layers 11 and 12 instead of the insulating layer 8. The P-type anode layer 6 is disposed on the N-type anode buffer layers 11 and 12, and above the drift layer 1.

Here, the N-type anode buffer layer (first N-type buffer layer) 11 is disposed above the N-type cathode layer 3 and on the drift layer 1.

The N-type anode buffer layer (second N-type buffer layer) 12 is disposed above the P-type cathode layer 4 and on the drift layer 1 while being adjacent to the N-type anode buffer layer 11 in a lateral direction. The N-type anode buffer 12 has an impurity concentration higher than the impurity concentration of the N-type anode buffer 11. For instance, the N-type anode buffer layer 12 has an impurity concentration higher than the impurity concentration of the N-type anode buffer layer 11 by more than an order of magnitude.

It is noted that the following inequality of impurity concentration is established in the second embodiment: the impurity concentration of the drift layer 1<the impurity concentration of the N-type anode buffer layer 11<the impurity concentration of the N-type anode buffer layer 12<the impurity concentration of the P-type anode layer 6.

The diode according to the second embodiment, which includes the N-type anode buffer layer 12 above the P-type cathode layer 4 having higher impurity concentration, reduces the tendency of a depletion layer in this region to extend to the cathode side. This prevents the punch through in the parasitic PNP bipolar transistor during the recovery operation of the diode, and by extension, prevents the current concentration in the region of the P-type cathode layer 4, thereby improving the breakdown strength.

<Modification>

The configuration in the second embodiment may be modified in various manners.

Figure 7:
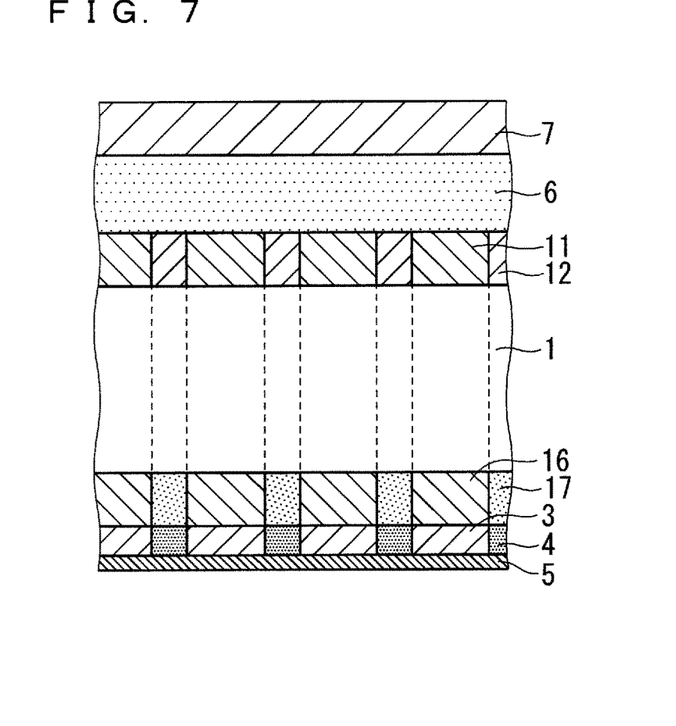
FIG. 7 is a cross-sectional view of the configuration of a diode according to a modification of the second embodiment.

For instance, in a first modification illustrated in FIG. 7, N-type cathode buffer layers 16 and 17 may be included instead of the N-type cathode buffer layer 2.

Here, the N-type cathode buffer layer (third N-type buffer layer) 16 is disposed on the N-type cathode layer 3 and under the drift layer 1.

The N-type cathode buffer layer (fourth N-type buffer layer) 17 is disposed on the P-type cathode layer 4 and under the drift layer 1 while being adjacent to the N-type cathode buffer layer 16 in a lateral direction. The N-type cathode buffer layer 17 has an impurity concentration higher than the impurity concentration of the N-type cathode buffer layer 16. For instance, the N-type cathode buffer layer 17 has an impurity concentration higher than the impurity concentration of the N-type cathode buffer layer 16 by more than an order of magnitude. It is noted that the following inequality of impurity concentration is established in the first modification: the impurity concentration of the drift layer 1<the impurity concentration of the N-type cathode buffer layer 16<the impurity concentration of the N-type cathode buffer layer 17. Such a configuration achieves an effect similar to that of the second embodiment.

Figure 8:
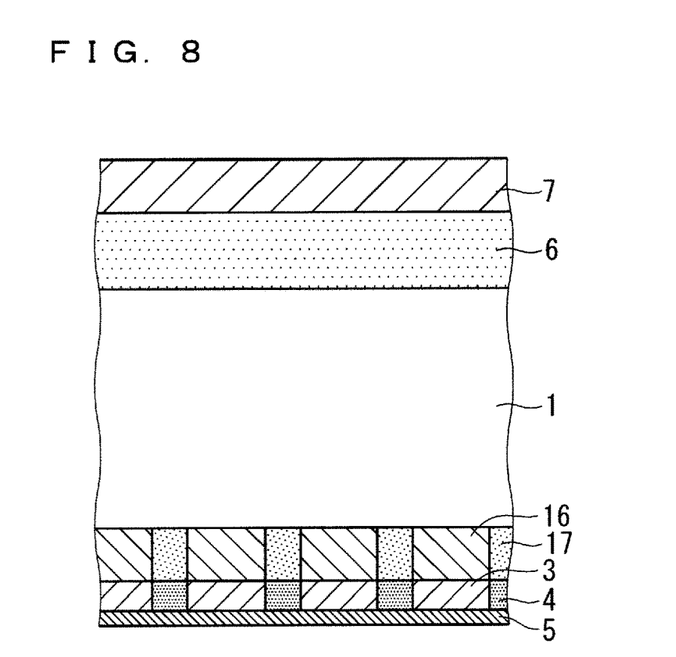
FIG. 8 is a cross-sectional view of the configuration of a diode according to a modification of the second embodiment.

For instance, in a second modification illustrated in FIG. 8, the N-type anode buffer layers 11 and 12 may be excluded from the configuration in FIG. 7. That is, the N-type cathode buffer layer (first N-type buffer layer) 16 is disposed on the N-type cathode layer 3 and under the drift layer 1; in addition, the N-type cathode buffer layer (second N-type buffer layer) 17 is disposed on the P-type cathode layer 4 and under the drift layer 1 while being adjacent to the N-type cathode buffer layer 16 in a lateral direction. The N-type cathode buffer layer 17 has an impurity concentration higher than the impurity concentration of the N-type cathode buffer layer 16. Such a configuration achieves an effect similar to that of the second embodiment.

Third Embodiment

Figure 9:
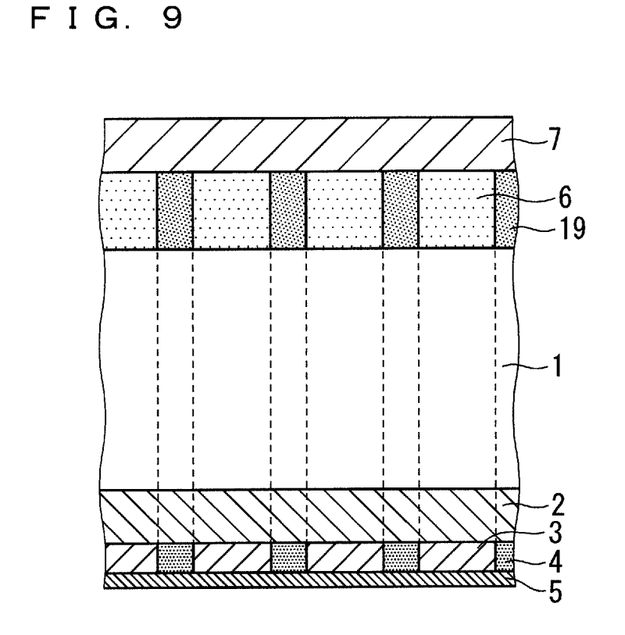
FIG. 9 is a cross-sectional view of the configuration of a diode according to a third embodiment.

FIG. 9 is a cross-sectional view of the configuration of a diode according to a third embodiment of the present invention. The same or similar components between the first and third embodiments are denoted by the same reference signs. Mainly described are components different between these embodiments.

The diode according to the third embodiment includes a P-type anode layer (third P-type semiconductor layer) 19 instead of the insulating layer 8. The P-type anode layer 19 is disposed above the P-type cathode layer 4 while being in contact with the P-type anode layer 6 and the anode electrode 7. The P-type anode layer 19 has a lifetime, τ1, shorter than the lifetime, τ2, of the P-type anode layer 6. That is, the following inequality is established: τ1<τ2. It is noted that a defect in the semiconductor layer produced by proton irradiation shortens the lifetime of the semiconductor layer. As a matter of course, such lifetime control may be performed not only through proton irradiation, but also through any other method.

In the diode according to the third embodiment, shortening the lifetime of the P-type anode layer 19 above the P-type cathode layer 4 eliminates, in a region of the P-type anode layer 19, part of the carriers entering the anode side when the punch-through occurs in the parasitic PNP bipolar transistor. This relieves the current concentration in the region of the P-type cathode layer 4 during the recovery operation, thereby improving the breakdown strength.

It is noted that in the present invention, the individual embodiments and modifications can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 drift layer, 3 N-type cathode layer, 4 P-type cathode layer, 6, 19 P-type anode layer, 7 anode electrode, 7a through-hole, 8 insulating layer, 11, 12 N-type anode buffer layer, 16, 17 N-type cathode buffer layer.

The invention claimed is:

1. A semiconductor device comprising:
a drift layer;
an N-type semiconductor layer and a first P-type semiconductor layer that are disposed below the drift layer while being adjacent to each other in a lateral direction;
a second P-type semiconductor layer disposed on the drift layer;
an electrode disposed on the second P-type semiconductor layer; and
an electrically insulating layer disposed above the first P-type semiconductor layer while being in contact with the second P-type semiconductor layer and the electrode, such that any one portion of the electrically insulating layer overlaps, in a vertical direction perpendicular to the lateral direction, only a corresponding portion of the first P-type semiconductor layer, wherein
no N-type semiconductor layer is provided between the second P-type semiconductor layer and the electrode.

2. The semiconductor device according to claim 1, wherein
the electrically insulating layer is buried in a lower surface of the electrode.

3. The semiconductor device according to claim 1, wherein
the electrically insulating layer is buried in an upper surface of the second P-type semiconductor layer.

4. The semiconductor device according to claim 1, wherein
the electrode comprises a through-hole, and
the electrically insulating layer is buried in the through-hole.

5. A semiconductor device comprising:
a drift layer;

an N-type semiconductor layer and a first P-type semiconductor layer that are disposed below the drift layer while being adjacent to each other in a lateral direction;

a second P-type semiconductor layer disposed on the drift layer;

an electrode disposed on the second P-type semiconductor layer; and a third P-type semiconductor layer disposed above the first P-type semiconductor layer while being in contact with the second P-type semiconductor layer and the electrode, such that any one portion of the third P-type semiconductor layer overlaps, in a vertical direction perpendicular to the lateral direction, only a corresponding portion of the first P-type semiconductor layer, the third P-type semiconductor layer having a lifetime shorter than a lifetime of the second P-type semiconductor layer, wherein no N-type semiconductor layer is provided between the second P-type semiconductor layer and the electrode.

6. A semiconductor device comprising:

a drift layer;

an N-type semiconductor layer and a first P-type semiconductor layer that are disposed below the drift layer while being adjacent to each other in a lateral direction;

a second P-type semiconductor layer disposed on or above the drift layer;

an electrode disposed on the second P-type semiconductor layer;

a first N-type buffer layer disposed above the N-type semiconductor layer and on the drift layer, or disposed on the N-type semiconductor layer and under the drift layer; and a second N-type buffer layer disposed above the first P-type semiconductor layer and on the drift layer, or disposed on the first P-type semiconductor layer and under the drift layer, while being adjacent to the first N-type buffer layer in a lateral direction, such that any one portion of the second N-type buffer layer overlaps, in a vertical direction perpendicular to the lateral direction, only a corresponding portion of the first P-type semiconductor layer, wherein the second N-type buffer layer has an impurity concentration higher than an impurity concentration of the first N-type buffer layer, a width of the second N-type buffer layer in the lateral direction is equal to a width of the first P-type semiconductor layer in the lateral direction, and no N-type semiconductor layer is provided between the second P-type semiconductor layer and the electrode.

7. The semiconductor device according to claim 6, wherein the first N-type buffer layer is disposed above the N-type semiconductor layer and on the drift layer, the second N-type buffer layer is disposed above the first P-type semiconductor layer and on the drift layer, the semiconductor device comprises:

a third N-type buffer layer disposed on the N-type semiconductor layer and under the drift layer; and a fourth N-type buffer layer disposed on the first P-type semiconductor layer and under the drift layer while being adjacent to the third N-type buffer layer in a lateral direction, and the fourth N-type buffer layer has an impurity concentration higher than an impurity concentration of the third N-type buffer layer.

\* \* \* \* \*